(12) United States Patent
Ho (10) Patent No.: US 7,252,242 B2
(45) Date of Patent: *Aug. 7, 2007

(54) METHOD FOR PROVIDING ADDITIONAL SERVICE BASED ON DUAL UICC

(76) Inventor: Chun-Hsin Ho, 7F-1, No. 180, Sec. 2, Dunhua S. Rd., Da-an District, Taipei City 106 (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/327,625

(22) Filed: Jan. 6, 2006

(65) Prior Publication Data

US 2006/0175418 A1 Aug. 10, 2006

Related U.S. Application Data

(63) Continuation-in-part of application No. 11/051,857, filed on Feb. 4, 2005.

(51) Int. Cl.
*G06K 19/06* (2006.01)
(52) U.S. Cl. ............................... 235/492; 235/487
(58) Field of Classification Search ............... 235/380, 235/487, 492
See application file for complete search history.

(56) References Cited

U.S. PATENT DOCUMENTS

| | | | | |
|---|---|---|---|---|
| 4,562,535 | A | 12/1985 | Vincent et al. | 364/200 |
| 5,055,968 | A * | 10/1991 | Nishi et al. | 361/737 |
| 6,029,892 | A | 2/2000 | Miyake | 235/380 |
| 6,173,900 | B1 | 1/2001 | Yoshigi et al. | 235/492 |
| 6,341,069 | B1 | 1/2002 | Torlotin | 361/737 |
| 6,532,158 | B1 | 3/2003 | Buttet | 361/796 |
| 6,581,830 | B1 | 6/2003 | Jelinek et al. | 235/441 |
| 6,607,127 | B2 | 8/2003 | Wong | 235/451 |
| 6,623,305 | B2 | 9/2003 | Chun-Lung | 439/630 |
| 6,786,417 | B1 | 9/2004 | Kondo et al. | 235/492 |
| 6,811,082 | B2 | 11/2004 | Wong | 235/451 |
| 6,922,780 | B1 * | 7/2005 | Siegel | 713/189 |
| 2003/0006878 | A1 | 1/2003 | Chung | 340/5.25 |
| 2004/0015738 | A1 | 1/2004 | Chang | 714/30 |
| 2004/0087213 | A1 | 5/2004 | Kao | 439/638 |

(Continued)

FOREIGN PATENT DOCUMENTS

EP    0840247 B1    5/1998

(Continued)

*Primary Examiner*—Michael G. Lee
*Assistant Examiner*—April A. Taylor
(74) *Attorney, Agent, or Firm*—Kusner & Jaffe (57) ABSTRACT

A method for providing additional services by a UICC applied in a cellular phone is provided. First, an aperture would be formed on the UICC provided by a first service provider, and the UICC may include a first IC and first contact pads coupled to the first IC. This aperture could be formed by means of a puncher. After that, a laminated integrated circuit card would be attached to the UICC by a second service provider to form a dual UICC. Such laminated integrated circuit card may include a second IC and second contact pads coupled to the second IC, and the second IC is deposited in said aperture. Preferably, the size of the second IC or the shell protecting the second IC fits perfectly for the aperture, and the great reliability could therefore be ensured. Finally, the additional service is able to be provided based on the dual UICC via wireless transmission or reception of the cellular phone.

24 Claims, 6 Drawing Sheets

U.S. PATENT DOCUMENTS

| | | | |
|---|---|---|---|
| 2005/0212657 A1 | 9/2005 | Simon | 340/5.74 |
| 2005/0231921 A1 | 10/2005 | Noda et al. | 361/737 |
| 2006/0047961 A1 | 3/2006 | Hashimoto et al. | 713/173 |
| 2006/0131396 A1* | 6/2006 | Blossom | 235/380 |

FOREIGN PATENT DOCUMENTS

| | | |
|---|---|---|
| EP | 0845837 B1 | 6/1998 |
| EP | 1079324 A1 | 8/1999 |

* cited by examiner

METHOD FOR PROVIDING ADDITIONAL SERVICE BASED ON DUAL UICC

RELATED APPLICATIONS

This application is a continuation-in-part application of U.S. application Ser. No. 11/051,857, filed on Feb. 4, 2005, and is fully incorporated herein by reference.

FIELD OF THE INVENTION

The present invention is related to a method for providing services based on a UICC (universal integrated circuit card), particularly to a method for providing additional services by processing a traditional UICC into a dual UICC.

BACKGROUND OF THE INVENTION

A smart card is extensively applied to two segments, one is for the Subscriber Identity Module (SIM) in wireless communication, another is the identification system, such as a financial card, ATM card or health insurance card. The SIM card is used in a mobile communication device. A person who uses a wireless network system, such as GSM or CDMA system, has a SIM card provided by a communication company. A SIM card stores user information, such as the user's phone numbers, phone books, call restrictions, personal identity number (PIN) and personal unblock key (PUK). Further, a legal SIM card is adopted by a GSM communication system for communication, so that the user may be allowed to enter the GSM communication network for transmitting information.

Smart cards (also known as smart tokens) can be standard credit card sized plastic cards with embedded computer chips, or plug-in sized SIM cards within mobile devices or for plugging directly into universal serial bus ports on personal computers. The chip on each SIM allows a single card to be programmed to do many things, such as functioning as a credit card or handling electronic cash. Old applications can be deleted, and new applications can be downloaded onto a card at a later time. The chip itself is designed to be tamper-proof, and information stored on the card can be from theft, forgery or duplication.

With the wide-spread usage of smart cards in mobile industry such as SIM for GSM, USIM for WCDMA, RUIM for CDMA2000 and PIM for PHS network, a large variety of applications have been developed utilizing smart cards resided in a mobile phone (SIM/USIM/RUIM/PIM, hereafter referred to as UICC, Universal Integrated Circuit Card) to provide security services. Mobile operators ensure the security of the use of mobile service by authenticating the keys stored in the smart cards that mobile operators issue to the subscribers. Mobile operators also provide premium services like mobile banking, mobile stock trading service by storing in the SIM cards keys provided by the banks or other service providers. The keys are manipulated through an application interface developed by a SIM Tool Kit (STK), which also resided in the SIM card. When WAP (Wireless Application Protocol) phones became available, WIM (Wireless Identity Module) was also developed by the SIM card vendors to secure WAP security by storing the certificate and PKI algorithm in the SIM (SWIM card) or another standalone WIM card which can be inserted into another card slot in the mobile phone.

The keypad and display screen of the mobile phone facilitate the inserted smart card with a larger user interface and the mobile nature of remote access to service providers further accomplishes the goal of service mobility. In order to enable service mobility, service providers like banks, credit card issuers, transportation card issuers, certificate issuers and stock brokers are willing to cooperate with mobile operators to issue enhanced SIM cards so as to provide services which fall, into their professions. However, the provision and management of SIM capability and functions are in the control of mobile operators, therefore it forms a closed system where only stipulated persons are allowed to participate. Furthermore, the relationship between service providers and mobile operators are one of mutual distrust and both have similar agendas as to control of security and payment methods. This becomes the main obstacle to the development of mobile security services.

In the mobile telecommunication world, another emerging demand based on smart card is called "multiple SIM ownership", which indicates the trend of a single mobile phone user holding more than one SIM cards issued by different mobile operators. The trend arises because of the following reasons:

ability to have separate accounts for personal and business use ability to have separate SIMs of mobile operators of different countries when traveling to save roaming fee charge ability to keep separate SIMs for different service plans, such as daytime and off-peak calling ability to keep separate SIMs for different promotion tariff packages to save cost A special mobile phone with dual chip or dual slot capability used to be introduced to resolve the above issues, by providing an additional chip slot on the mobile phone in order for the service provider or another mobile operator to issue its own smart card or SIM which stores its own secret keys. However, the special phones are usually costly and not well-accepted by users, thus creating a subo-market where service providers can play with. (Please refer to U.S. Pat. No. 6,623,305, Dual SIM card connector).

As aforementioned, to overcome the above obstacles of mobile services, especially transactional services, and to satisfy the business interest from different smart card issuers toward a single user, the inventor discloses a business method through a dual UICC system.

SUMMARY OF THE INVENTION

In view of the aforementioned problems, the present invention discloses business methods to provide value-added services based on a traditional UICC issued by a service provider including a mobile operator or bank. Without replacing the native UICC card which normally already stores important information such as personal phonebook, the methods provide additional services of another service provider in a convenient way based on existing infrastructure while the functions of the native UICC issued by the first service provider remains intact. All the user has to do is to allow the native UICC to be processed into a dual UICC by another or the same service provider. Such process of the native UICC could be done in few minutes, and the original information would be maintained and the functions of the native UICC remain intact.

According to one aspect of the present invention, a method for imposing additional services on a UICC in a cellular phone is provided. Firstly, an aperture would be formed on the plastic part of the native UICC issued by the first service provider, and the UICC may include the first IC and first contact pads coupled to the first IC. The plastic part of an integrated circuit chip card has no functionality related to the integrated circuit chip itself thus forming an aperture is harmless and has no impact onto the functionalities of the native integrated circuit chip card. This aperture could be formed by means of a puncher. The purposes of the aperture includes forming a niche to accommodate the chip of a laminated integrated circuit chip card, positioning the laminate integrated circuit chip card in accurate connection with the native UICC and fixing the laminated circuit card with the native UICC. After that, a laminated integrated circuit card would be attached to the UICC by the second service provider to form a dual UICC. Such laminated integrated circuit card may include the second IC and second contact pads coupled to the second IC, and the third contact pad providing the communication with the external world (the mobile phone or smart card reader), and the second IC is deposited in said aperture. Preferably, the size of the second IC or the shell protecting the second IC fits perfectly for the aperture, to ensure increased reliability of the combination. Finally, the additional service is able to be provided based on the dual UICC via the wireless transmission or reception of a cellular phone.

According to anther aspect of the present invention, a method for providing additional services by a UICC is provided. Initially, an aperture is formed on the UICC provided by the first service provider. Generally, the UICC includes the first IC and first contact pads coupled to the first IC. Then, a laminated integrated circuit card would be attached to the UICC by the second service provider to form a dual UICC, and the laminated integrated circuit card includes the second IC, second contact pads and an antenna coupled to the second IC and the third contact pad providing the communication with the external world (the mobile phone or smart card reader). The second IC is deposited in the aperture to maintain the thickness of the dual UICC same as a single card. Finally, the additional service is able to be provided based on the dual UICC.

DETAILED DESCRIPTION OF THE PREFERRED EMBODIMENT

The present invention is described with the preferred embodiments and accompanying drawings. It should be appreciated that all the embodiments are merely provided for illustration, instead of limitation. Although the present invention has been described in terms of the preferred embodiments, the invention is not constrained by these embodiments. The scope of the invention is defined by the claims. Modifications within the spirit of the invention will be possible to those having ordinary skills in the art.

Figure 1:
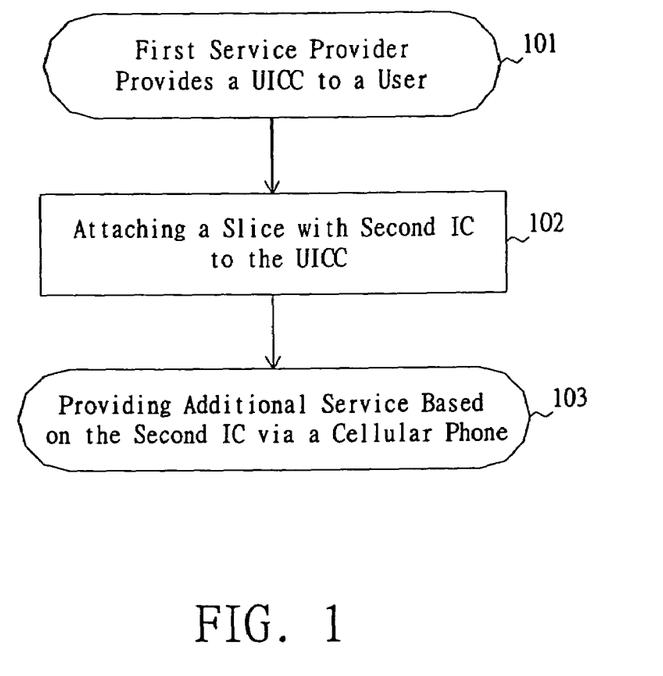
FIG. 1 is a flow chart of the method according to one embodiment.

Please refer to FIG. 1, which illustrates a flow chart of the method for providing an additional service by a UICC according to the preferred embodiment. Initially, the UICC is provided to a user by the first service provider, such as the mobile service provider, as shown in step 101. In this embodiment, the UICC is a SIM card which is generally used together with a cellular phone. As known to all, the cellular phone is used for mobile communication or data transmission, and the SIM card is inserted therein for identification. Conventionally, the SIM card is made of a substrate having the first IC and plural first contact pads coupled to the first IC. The first IC is then able to electrically couple to the cellular phone through the first contact pads. Moreover, the UICC may further include a USIM card, a RUIM card or a PIM card. It should be noted that the above types of the UICC are cited merely for illustration, instead of limitation. Other possible types of USIM could also be adapted in certain embodiments of the present invention.

Nevertheless, the capability of a traditional SIM card is limited, thus unable to afford a great variety of additional services. To break such limitation of capability, the present invention further provides the user with an extra IC, namely the second IC, to the original UICC. Since the size of the UICC, especially the thickness thereof, usually almost exactly fits for the slot in the cellular phone, the attached second IC should be made as thin as possible. In the preferred embodiment, the second IC is provided on a laminated integrated circuit card or substrate having plural second contact pads coupled to the second IC. As shown in step 102, the second service provider would attach the laminated integrated circuit card to the UICC to improve its capability. In this way, the conventional UICC is transformed into a dual UICC. Please refer to FIGS. 3 and 4, which show the preferred embodiment of the processing and structure of dual UICC 33.

Figure 3:
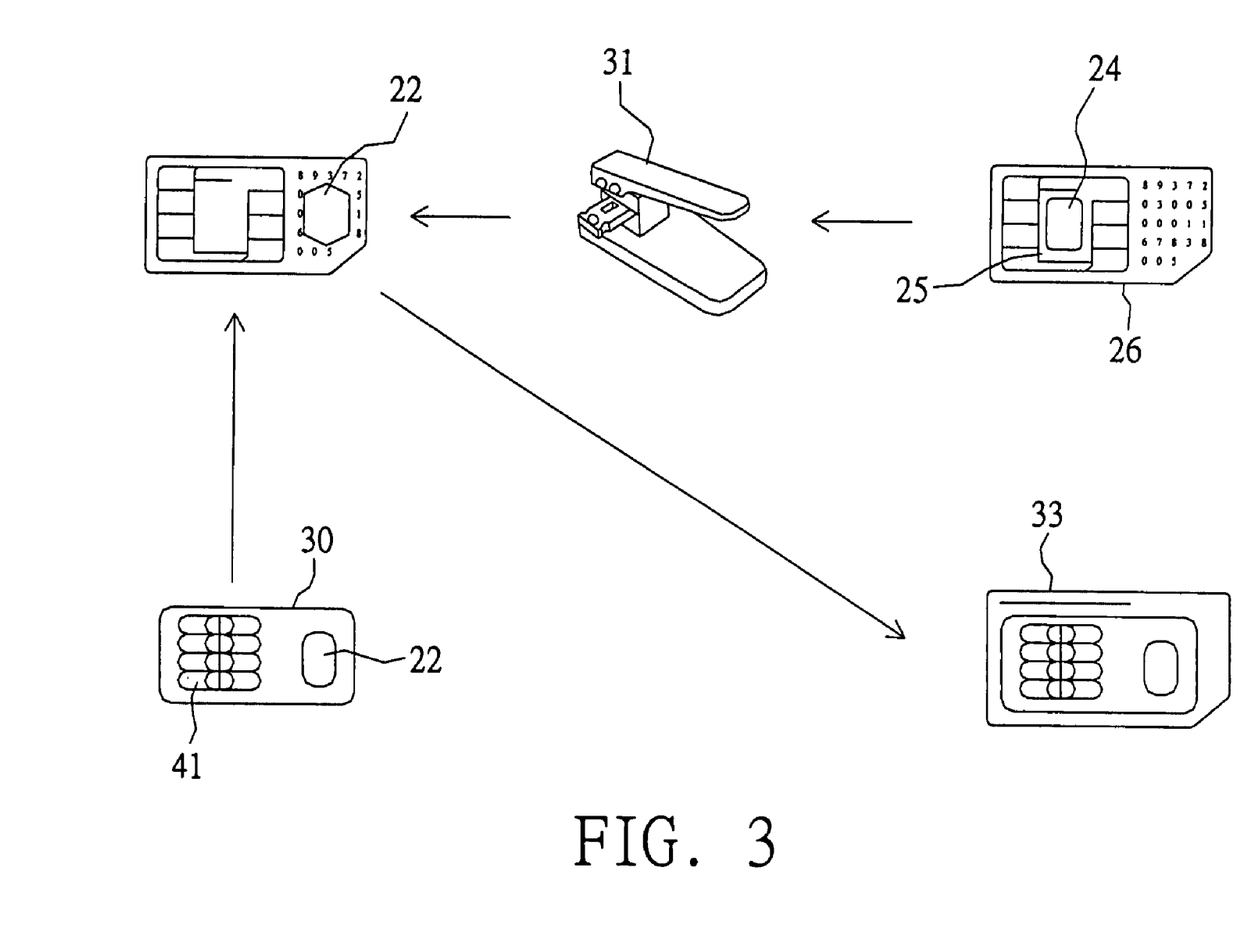
FIG. 3 is a diagram illustrating the process of the dual UICC.
Figure 4:
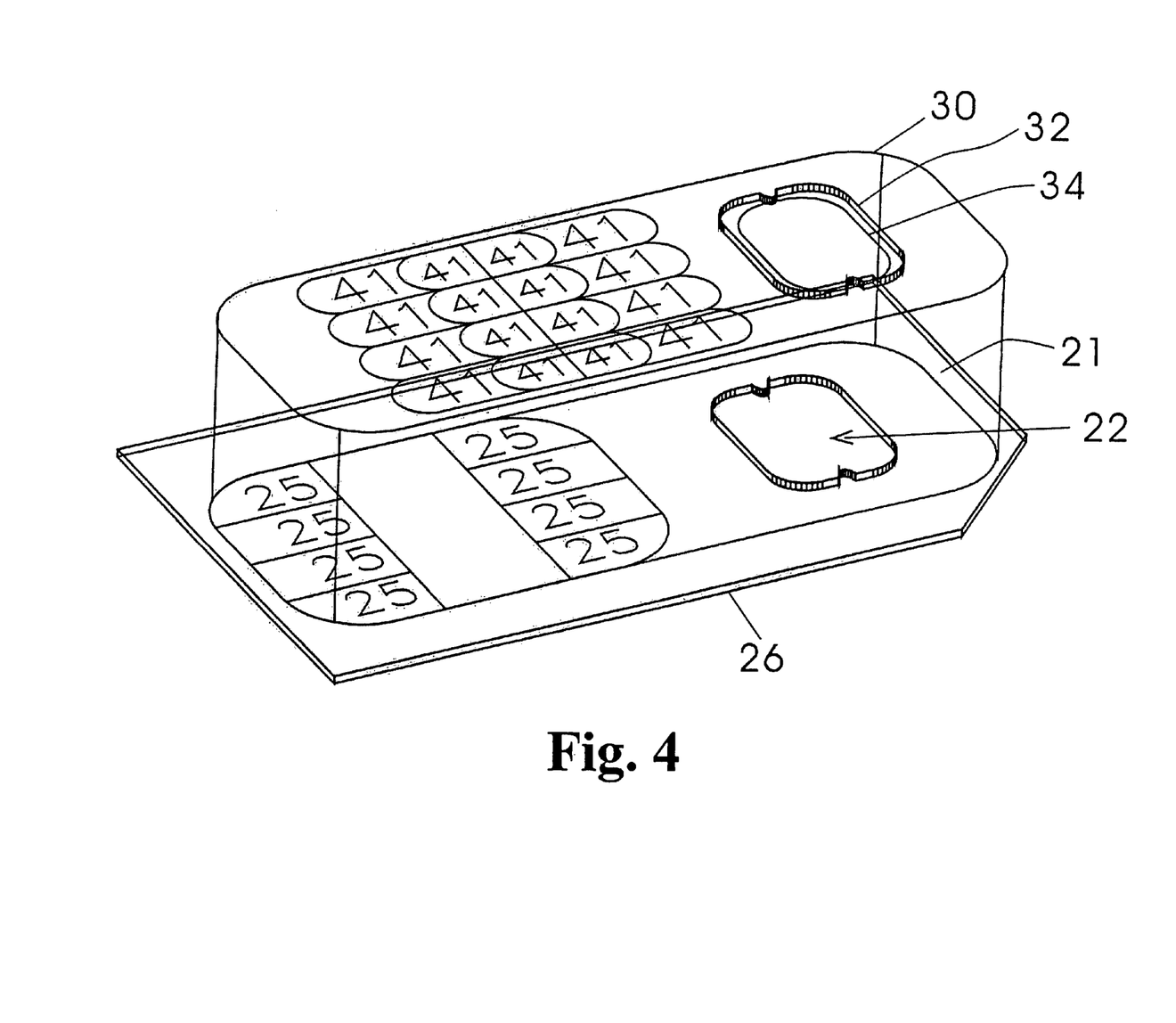
FIG. 4 is a diagram illustrating the dual UICC according to the present invention.

In the embodiment shown, the second contact pads 41 on the laminated integrated circuit card 30 may cover the first contact pads 25, fully or partially, and the first IC 24 as well as the second IC 22 could be both electrically coupled to the cellular phone. Consequently, the cellular phone could utilize both the first and second ICs. The dual UICC 33 in the present invention stands for a UICC having two or more operable ICs therein, either responsible for specific or common functions. Preferably, these provided functions could cooperate with each other.

Moreover, in order to control the thickness of the dual UICC 33 effectively, a puncher 31 may be utilized to form an aperture 22 on the substrate 21 for depositing the second IC 34. Since the second IC 34 is generally The thickest part of the laminated integrated circuit card 30, this scheme could therefore remarkably reduce the thickness. Preferably, the thickness of the dual UICC 33 is substantially the same as that of a conventional UICC. In FIG. 4, the second IC is usually covered by a package 32, which could be made by plastic or the like, to avoid any damage or outside interference. In the preferred embodiment, the size of the aperture 22 should perfectly fits for the profile of the package 32 to provide greater reliability.

The detailed structures and materials of the dual UICC 33 are fully disclosed in the pending US Patent Applications filed by the same applicant of the present application, and these applications are cited herein for references. Please refer to U.S. application Ser. No. 11/051,857, filed on Feb. 4, 2005 and Taiwan App. No. 094217529, filed on Oct. 11, 2005.

After the dual UICC 33 is constructed, the additional service is provided based on the second IC 34 via the cellular phone, as shown in step 103. More specifically, the additional service is provided based on the second IC 34 by the wireless transmission or reception of the cellular phone. For example, the second IC may provide the services of mobile banking or stock trading or even another subscription of mobile service. The user could apply the software or data in the second IC 34 to implement these additional mobile services. Besides, in order to enhance the ability and capability of security, the second IC 34 could also possess the function of extra identification or authorization. Such function is quite significant to the characteristics of mobile banking or stock brokerage service. Please refer to the detailed illustration of the pending US Patent Applications.

However, the additional service is not limited to the aforementioned examples. The dual UICC 33 could enable the cellular phone to process a great variety of additional functions, particularly those requiring transmission over the air (OTA) services in communication with a remote server. In other words, the present invention may allow all possible additional functions that are provided by the dual UICC 33 along with the cellular phone for OTA transmission. Furthermore, the provided functions of the dual UICC 33 could be modified over the air or over the wire. The user could download new software or encryption keys through mobile communication or Internet to expand the available functions. Consequently, the present invention could provide not only additional services without being constrained by the design of conventional UICC, but also notable flexibility to meet various demands of diversified users.

Figure 2:
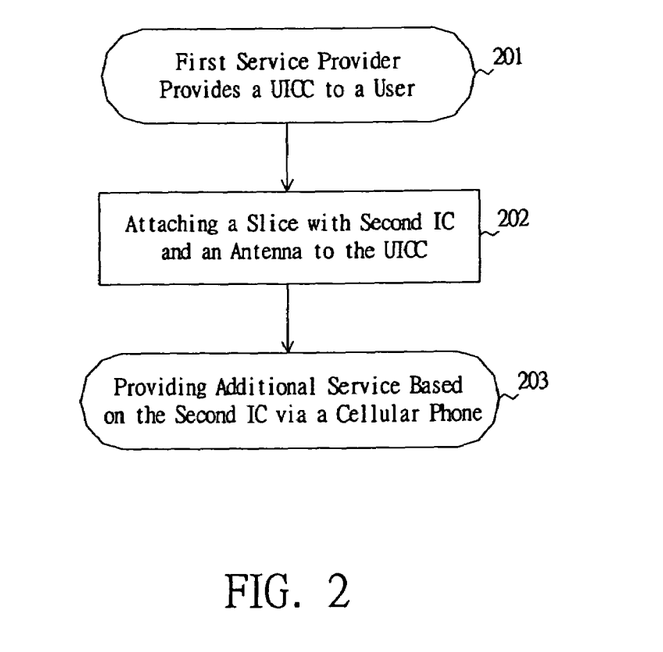
FIG. 2 is a flow chart of the method according to another embodiment.
Figure 5:
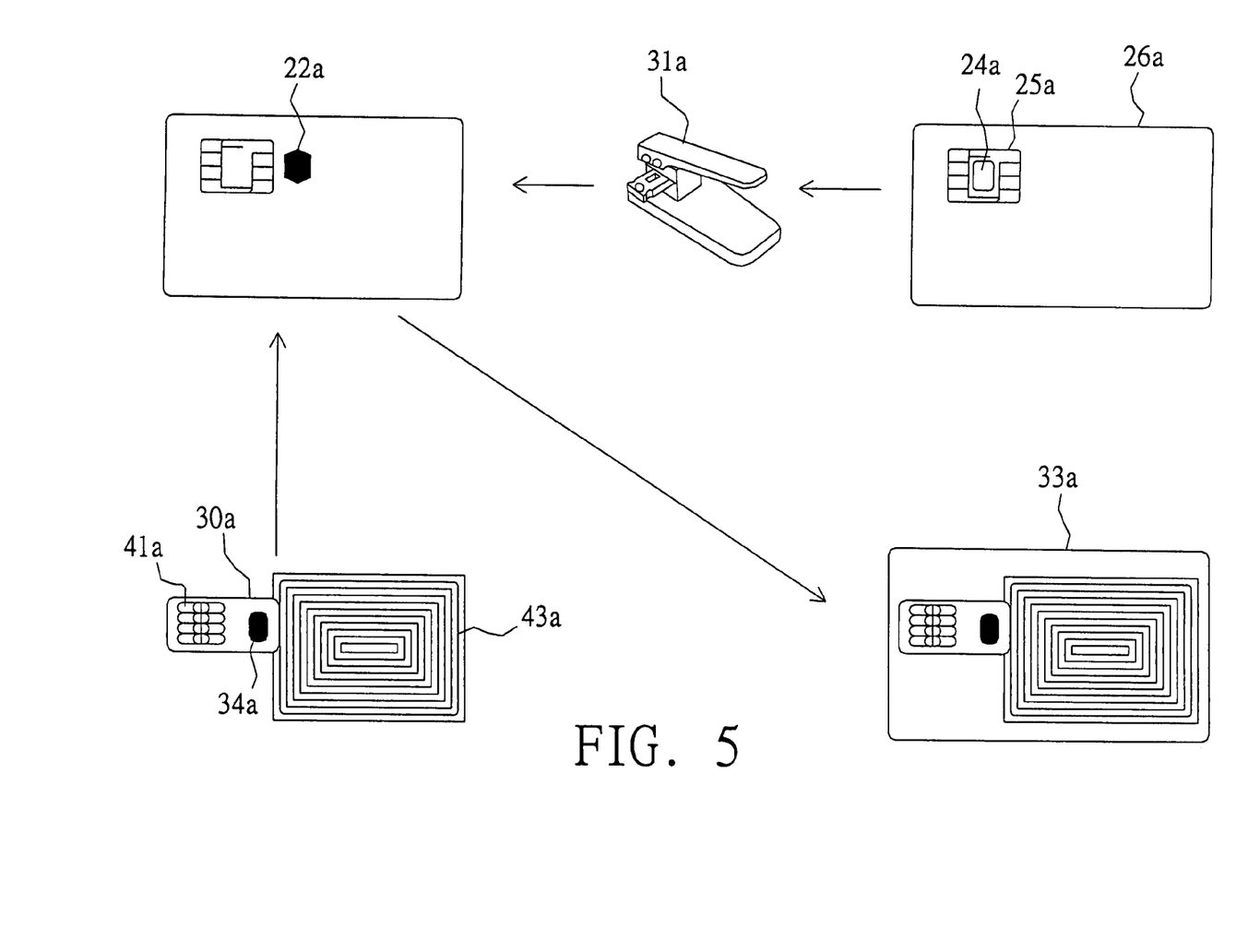
FIG. 5 is a diagram for illustrating the process of the dual UICC according to the present invention.
Figure 6:
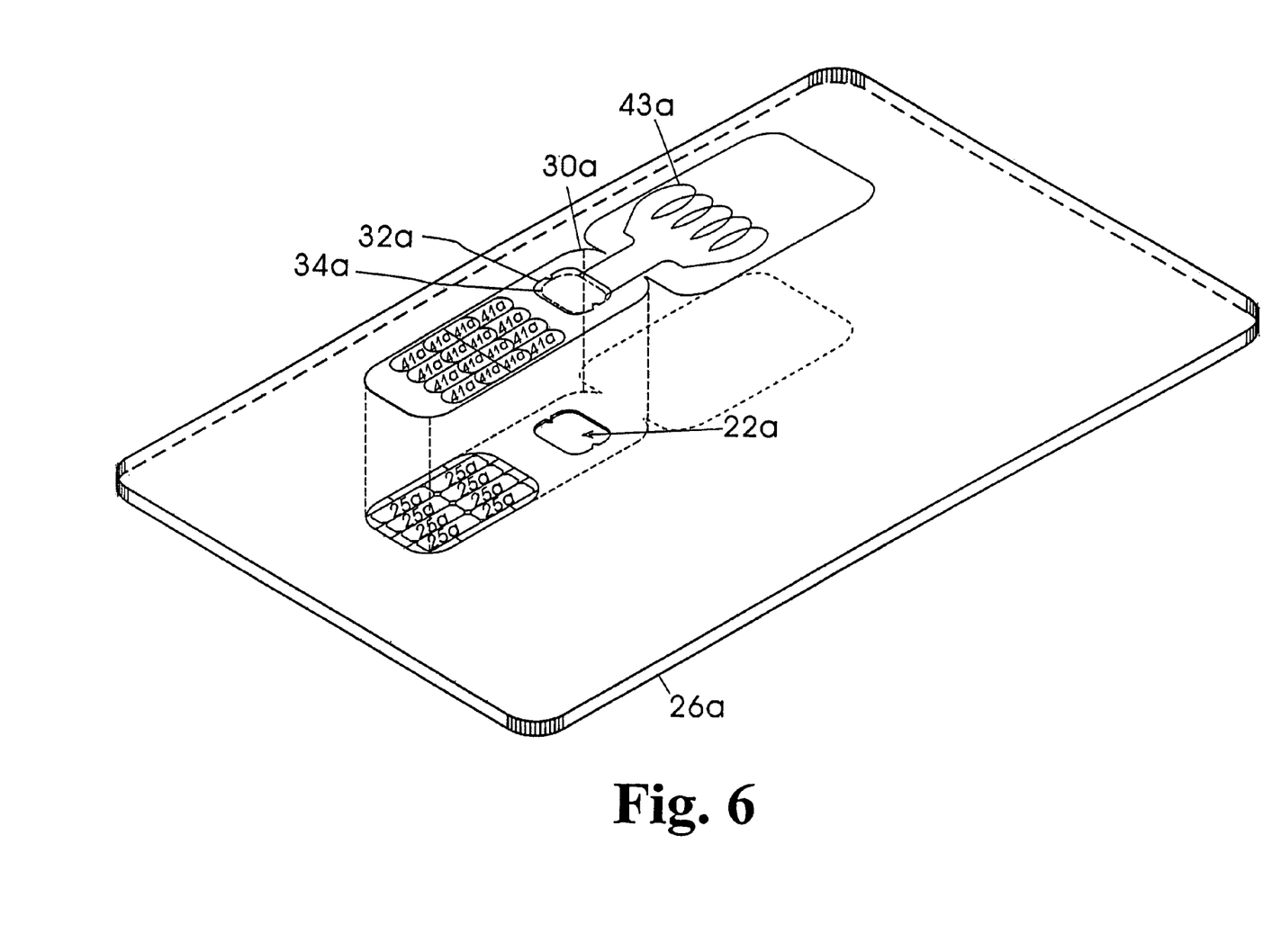
FIG. 6 is a diagram showing another embodiment of the dual UICC of the present invention.

Please refer to FIGS. 2, 5 and 6, which present another embodiment of the present invention. Similarly, the user would receive a UICC 26a from the first service provider, as shown in step 201. However, in this preferred embodiment, the size of the UICC 26a is somewhat larger, but the thickness is still substantially the same. This type of UICC 26a includes an ATM card, a credit card or a cash card, and the first service provider may be a bank or a financial corporation. In this embodiment, the UICC 26a is originally utilized for withdrawing money or making payment, and the structure thereof is substantially the same as that of the above embodiments, except the difference in size. For utilization of the scheme, please refer to the above pending US Patent Applications.

In order to significantly expand the functions of the traditional UICC 26a, a laminated integrated circuit card or substrate 30a with a second IC 34a as well as an antenna 43a is provided. Similarly with the above similar process, the laminated integrated circuit card 30a would be attached to the UICC 26a to form a dual UICC 26a, as shown in step 202. The antenna 43a is mainly applied for contactless payment, authorization or RFID.

In a situation where the UICC 26a is an ATM card and the first service provider is a bank, such UICC 26a may maintain the information of the user's bank account. The first contact pads 25a of the UICC 26a may be covered, fully or partially, by the second contact pads 41a, and the first IC 24a and second IC 34a may be both electrically coupled to an ATM. Prior to making the contactless payment, the user has to earmark certain amount of money from the bank account by manipulating the ATM or a POS (point of sale), and the earmarked information would be kept by the second IC 34a. Consequently, the user could merely place the processed dual UICC 33a in a position around a sensor to quickly finish the payment process.

Figure 7:
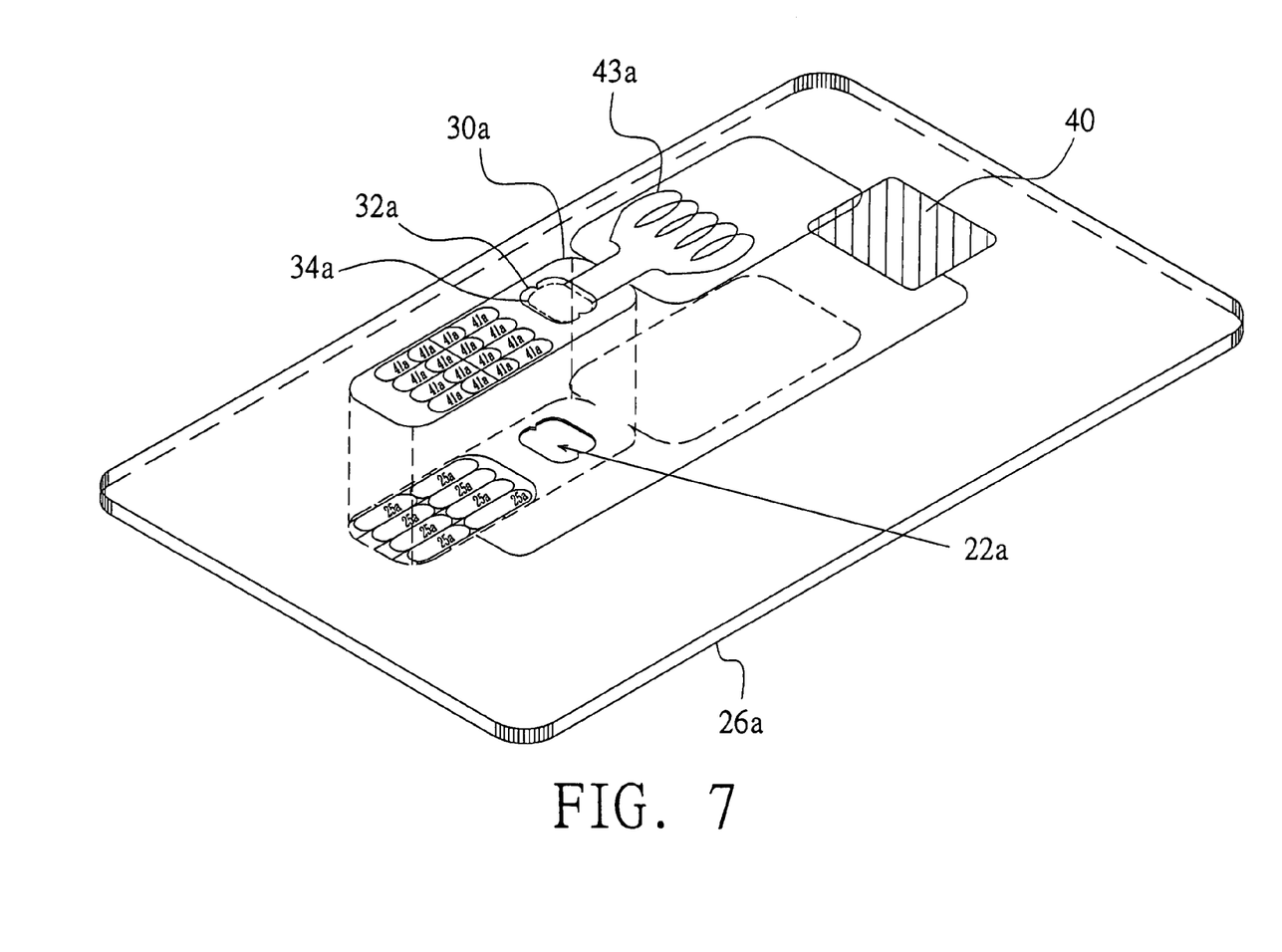
FIG. 7 is a diagram showing a further embodiment of the dual UICC of the present invention.

Alternatively, a fingerprinting sensor 40 may be incorporated in the UICC for the security application. The fingerprint sensor 40 could be embedded into the first UICC for instance and coupled to one of the first or second IC, or it could be equipped with an external device that is electrically connected to The dual UICC. Please refer to FIG. 7. In The example, the fingerprint sensor 40 is formed in the UICC 26a. It should be appreciated that the examples are merely cited for illustration, instead of limitation. Accordingly, the fingerprint sensor 40 could be formed on any suitable location of the UICC 26a and the attached laminated integrated circuit card 30a may also be used for any other possible application.

Moreover, the UICC 26a or the dual UICC 33a must usually be inserted in a slot of the ATM or POS, so the thickness thereof does matter. In order to remarkably reduce the thickness, this embodiment adopts the same scheme, namely using a puncher 31a to punch an aperture 22a on the UICC 26a to receive the second IC 34a. As seen in FIG. 6, the second IC 34a is protected by a package 32a, and the aperture 22a preferably fits the shell 32a to provide great steadiness.

Compared with the prior art that involves a single issuer, one advantage of the present invention is that the original smart card can function with the second IC chip card according to the present invention without the need to remove one card. The present invention can be applied to the contactless finance or transaction service, so that the combination of different businesses for providing more convenient services to users.

According to another concept of the present invention, the present invention includes a security aspect, so that the dual IC chip card system may be employed to improve the security level of the electronic commerce under the current electronic commerce environment. Compared with the prior art, the present invention has following advantages: (1) based on the present invention, the present invention may provide the service of issuing the personalized services without upgrading the existing wireless communication infrastructure or upgrading the portable device. (2) For third party service providers, the present invention saves the operating and logistic costs for working with mobile operators to jointly issue the traditional SIM Application Tool Kit (STK) service on the SIM card. (3) A hardware security (chip security) is provided directly from third party service providers.

As understood by a person skilled in the art, the foregoing preferred embodiments of the present invention are illustrative of the present invention rather than limiting the present invention. It is intended to cover various modifications and similar arrangements included within the spirit and scope of the appended claims, the scope of which should be accorded the broadest interpretation so as to encompass all such modifications and similar structures. While the preferred embodiment of the invention has been illustrated and described above, it will be appreciated that various changes can be made therein without departing from the spirit and scope of the invention.

I claim:

1. A method for providing an additional service on an integrated circuit card (ICC) applied in a device, which comprises:
   forming an aperture on said ICC including a first IC and an interface;
   supplying a laminated integrated circuit card having a second IC onto said ICC to form a dual ICC, said second IC being within said aperture and coupled to said ICC through said interface; and
   providing said additional service based on said dual ICC via said device.

2. The method as set forth in claim 1, wherein said device includes a cellular phone.

3. The method as set forth in claim 1, wherein said additional service is provided though wireless transmission.

4. The method as set forth in claim 1, wherein said second IC enables a dual phone number function.

5. The method as set forth in claim 1, wherein said ICC includes a SIM card, a USIM card, a RUIM card or a PIM card.

6. The method as set forth in claim 1, wherein said additional service includes a security service.

7. The method as set forth in claim 1, wherein said additional service includes identification or authorization.

8. The method as set forth in claim 1, wherein said second IC includes memory.

9. The method as set forth in claim 1, wherein said aperture is made by a puncher.

10. The method as set forth in claim 1, wherein said additional service is provided by transmission over the air (OTA) or over a wire.

11. The method as set forth in claim 10, wherein said additional service includes downloading new software or encryption keys.

12. The method as set forth in claim 10, wherein said ICC includes an ATM card, a credit card or a cash card.

13. The method as set forth in claim 10, wherein a sum of money is earmarked from an account by using an ATM or a POS (point of sale) for contactless payment via said antenna.

14. The method as set forth in claim 13, wherein said first IC maintains information of said account.

15. A method for providing an additional service by a ICC (integrated circuit card), which comprises:
    forming an aperture on said ICC including a first IC and an interface;
    supplying a laminated integrated circuit card having a second IC on said ICC to form a dual ICC, wherein said second IC is within said aperture, and an antenna is coupled to said second IC; and
    providing the additional service based on said dual ICC, wherein said dual ICC is coupled to a fingerprinting sensor.

16. The method as set forth in claim 15, wherein the second service is provided through wireless transmission.

17. A method for providing an additional service by an ICC (integrated circuit card), which comprises:
    issuing said ICC by a first service provider for providing a first service, wherein said ICC includes a first IC and an interface;
    issuing a laminated integrated circuit card by a second service provider for providing a second service;
    supplying said laminated integrated circuit card onto said ICC, wherein said laminated integrated circuit card includes a second IC coupled to said ICC through said interface.

18. The method as set forth in claim 17, wherein said second IC enables a dual phone number function.

19. The method as set forth in claim 17, wherein said ICC includes a SIM card, a USIM card, a RUIM card or a PIM card and said first service provider includes mobile service provider.

20. The method as set forth in claim 17, wherein the second service includes security service, identification or authorization.

21. The method as set forth in claim 17, wherein said second IC includes memory.

22. The method as set forth in claim 17, wherein said ICC includes an ATM card, a credit card or a cash card, and said first service provider includes a bank.

23. The method as set forth in claim 17, further comprising an antenna coupled to said laminated integrated circuit card for radio frequency identification (RFID) or authorization.

24. The method as set forth in claim 17, further comprising a fingerprint sensor coupled to said dual ICC.

* * * * *